(12) United States Patent
Nakazato et al.

(10) Patent No.: US 6,567,326 B2
(45) Date of Patent: May 20, 2003

(54) SEMICONDUCTOR MEMORY DEVICE

(75) Inventors: Takaaki Nakazato, Kawasaki (JP); Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/923,948

(22) Filed: Aug. 8, 2001

(65) Prior Publication Data

US 2002/0021608 A1 Feb. 21, 2002

(30) Foreign Application Priority Data

Aug. 9, 2000 (JP) ........................................ 2000-241478

(51) Int. Cl.[7] ................................................ G11C 7/00
(52) U.S. Cl. ........................ 365/203; 365/205; 365/208; 365/210
(58) Field of Search ................................ 365/154, 156, 365/203, 189.02, 210, 205, 207, 208

(56) References Cited

U.S. PATENT DOCUMENTS

| | | | | |
|---|---|---|---|---|
| 5,034,923 A | * | 7/1991 | Kuo et al. | 365/154 |
| 5,065,363 A | | 11/1991 | Sato et al. | 365/154 |
| 5,257,236 A | * | 10/1993 | Sharp | 365/189.04 |
| 5,265,047 A | | 11/1993 | Leung et al. | 365/154 |
| 5,317,537 A | | 5/1994 | Shinagawa et al. | 365/189.04 |
| 5,815,432 A | * | 9/1998 | Naffziger et al. | 365/154 |
| 6,166,946 A | * | 12/2000 | Naffziger | 365/154 |
| 6,181,608 B1 | * | 1/2001 | Keshavarzi et al. | 365/154 |

* cited by examiner

Primary Examiner—Son Mai
(74) Attorney, Agent, or Firm—Oblon, Spivak, McClelland, Maier & Neustadt, P.C.

(57) ABSTRACT

A semiconductor device comprises a first bit line, a second bit line, a memory cell electrically coupled to the first bit line and the second bit line, a first amplification circuit configured to amplify a potential of the first bit line and a second amplification circuit configured to amplify a potential of the second bit line.

25 Claims, 16 Drawing Sheets

SEMICONDUCTOR MEMORY DEVICE

CROSS-REFERENCE TO RELATED APPLICATIONS

This application is based upon and claims the benefit of priority from the prior Japanese Patent Application No. 2000-241478, filed Aug. 9, 2000, the entire contents of which are incorporated herein by reference.

BACKGROUND OF THE INVENTION

1. Field of the Invention

The present invention relates to a semiconductor memory device.

2. Description of the Related Art

FIG. 15 is a circuit diagram showing a conventional semiconductor memory device.

As shown in FIG. 15, in the conventional memory device, a word line WL (WL0 or WL1) and two bit lines BL (BL0 and BL1) are independently connected to a memory cell (memory element).

A data read circuit is connected between two bit lines BL0 and BL1. A sense amplification circuit (sense AMP. circuit) of a differential amplification type for differential-amplifying potential difference between two bit lines BL0 and BL1 is used in the Data Read Circuit.

An example of the memory cell is a SRAM cell. The SRAM cell includes, for example, two inverters that are connected to each other in a cross-coupled manner, that is, a latch circuit and two N-channel type MOSFETs that connect the latch circuit to the bit lines BL0 and BL1 in accordance with a potential of the word line WL. Thus, when the word line is activated, the bit lines BL0 and BL1 are electrically connected to the memory cell and a charge can be moved mutually in such a manner that from the bit lines BL0 and BL1 to the memory cell, or from the memory cell to the bit lines BL0 and BL1. A drain of P-channel type MOSFETs whose gate receives a pre-charge signal and whose source receives a fixed electric potential is connected to the bit lines BL0 and BL1. The P-channel type MOSFETs constitute a pre-charge circuit and used for pre-charge operation to be described later.

The sense AMP, circuit includes the latch circuit. The N-channel type MOSFET that is connected to earthed electric potential in accordance with a sense AMP. enable signal (S/A enable signal) and a pair of the P-channel type MOSFETs that are connected to the bit lines BL0 and BL1 in accordance with the S/A enable signal are connected to the latch circuit. Accordingly, when the S/A enable signal is activated, the latch circuit is connected to the earthed electric potential and disconnected from the bit lines BL0 and BL1. At the timing when the S/A enable signal is activated, a slight amount of potential difference at the relevant time between the bit lines BL0 and BL1 is detected and the latch circuit amplifies the potential difference to a potential difference of CMOS level.

Next, operation of the conventional memory device will be described.

FIG. 16 is an operation waveform chart showing operation of the conventional memory device.

As shown in FIG. 16, in general, each electric potential of the bit lines BL0 and BL1 is set at a predetermined value (In FIG. 16, "HIGH" level is adopted.), before starting read/writing operation.

In the read operation, when the word line WL is activated, the memory cell is connected to the bit lines BL0 and BL1. Electric potential of one bit line declines gradually in accordance with data stored in the latch circuit and a potential of the other bit line maintains "HIGH" level. The potential difference between the bit lines BL0 and BL1 is amplified by the sense AMP. circuit and output. After that, the word line WL is deactivated and the memory cell is disconnected from the bit lines BL0 and BL1. When a pre-charge signal comes to "LOW" level, each electric potential of bit lines BL0 and BL1 is changed to "HIGH" level by the pre-charge circuit. This process is called pre-charge.

In the writing operation, the word line WL is activated and the memory cell is connected to the bit lines BL0 and BL1. Furthermore, when a write enable signal is activated, the potential of one bit line is changed to "Low" level by a data write circuit and the potential of the other bit line maintains "HIGH" level. Accordingly, data is written in the memory cell. After that, the word line WL is deactivated and each potential of the bit lines BL0 and BL1 changes to "HIGH" level (pre-charge) in the same manner as the read operation.

As described above, the pre-charge is necessary after the read/write operation and plenty of time is spend on the pre-charge, in fact. A great deal of time required for the pre-charge is particularly necessary when the pre-charge is carried out after writing data with the bit line driven to "LOW" level and the read operation is carried out immediately after the pre-charge.

In this case, since the potential of the bit line drops to "low" level first and then changes to "HIGH" level, the voltage varies largely and accordingly plenty of transition time is required.

Additionally, in the read operation, the sense AMP. circuit detects a very slight amount of potential difference between the bit lines BL0 and BL1. Therefore, when the read operation is started in an imperfect pre-charge state, possibility of causing malfunction is increased. For this reason, the read operation must be waited until the electric potential of the bit lines completely comes to "HIGH" level.

A cycle of a clock cannot be shortened less than time for a series of the above operation, that is, time required from the write operation to completion the pre-charge, or from the read operation to completion of the pre-charge. Thus, operation frequency of the conventional memory device is rate-limited.

BRIEF SUMMARY OF THE INVENTION

A semiconductor device according to a first embodiment of the present invention comprises: a first bit line; a second bit line; a memory cell electrically coupled to the first bit line and the second bit line; a first amplification circuit configured to amplify a potential of the first bit line; and a second amplification circuit configured to amplify a potential of the second bit line, the second amplification circuit being inactive when the first amplification circuit is active and being active when the first amplification circuit is inactive, in read operation.

A semiconductor device according to a second embodiment of the present invention comprises: a first bit line; a second bit line; a memory cell electrically coupled to the first bit line and the second bit line; a amplification circuit configured to amplify a potential of the first bit line and a potential of the second bit line; and a multiplexer which selects the first bit line or the second bit line and electrically couples a selected bit line to the amplification circuit.

A semiconductor device according to a third embodiment of the present invention comprises: a first bit line; a second bit line; a memory cell electrically coupled to the first bit line and the second bit line; a first amplification circuit configured to amplify a potential of the first bit line; a second amplification circuit configured to amplify a potential of the second bit line; and a pre-charge circuit configured to pre-charge the first and second bit lines, the pre-charge circuit pre-charging the second bit line when the first amplification circuit is active, and pre-charging the first bit line when the second amplification circuit is active.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

DETAILED DESCRIPTION OF THE INVENTION

Hereinafter, embodiments of the present invention will be described referring to the accompanying drawings. For the description, the same constituting elements are indicated by the same reference symbols for all of the drawings.

First Embodiment

Figure 1:
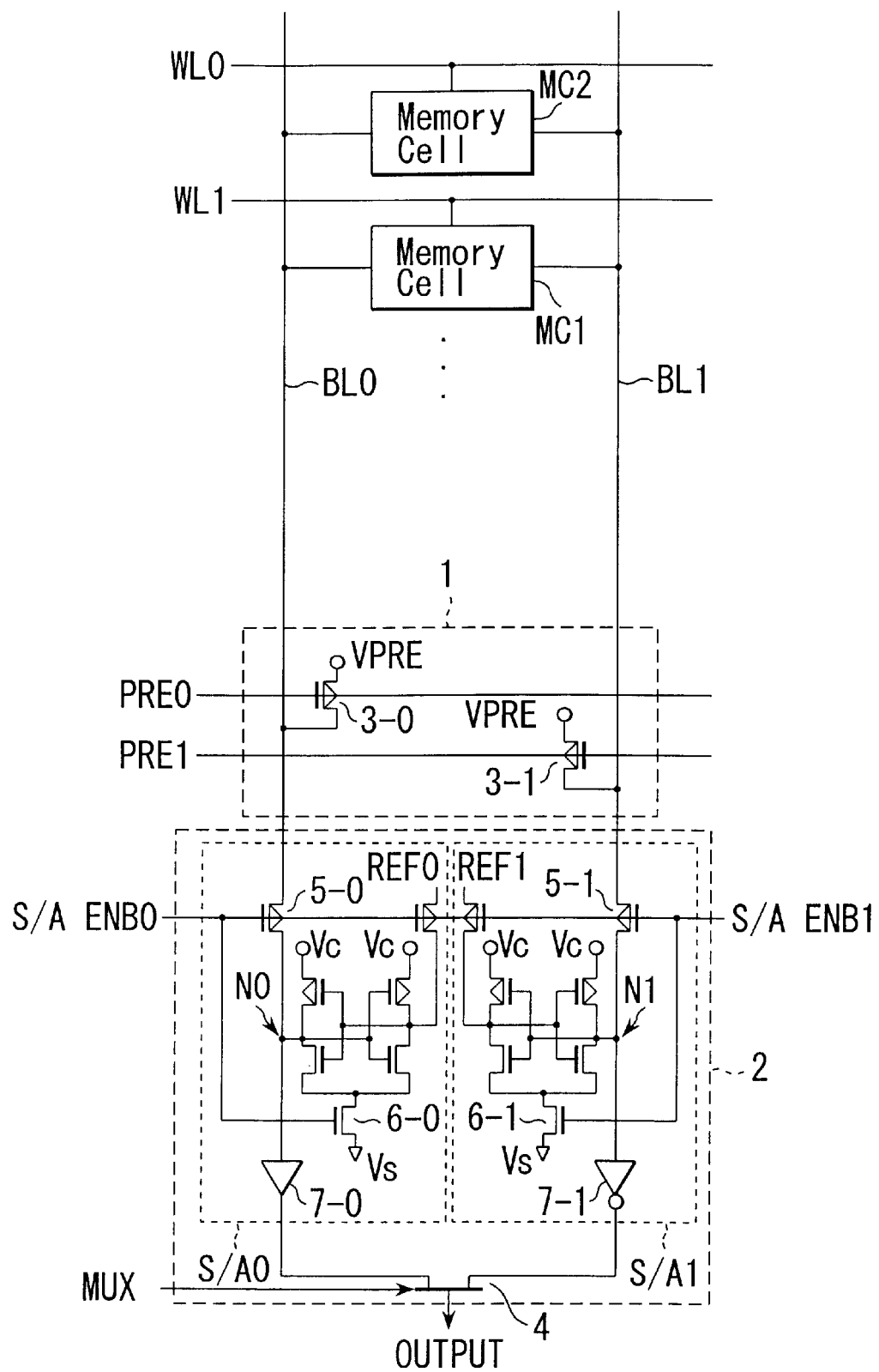
FIG. 1 is a circuit diagram showing a semiconductor memory device according to a first embodiment of the present invention.

FIG. 1 is a circuit diagram showing a semiconductor memory device according to a first embodiment of the present invention.

As shown in FIG. 1, a memory cell MC1 is connected to bit lines BL0 and BL1 and a memory cell MC2 is connected to the bit lines BL0 and BL1. An example of each of the memory cells MC1 and MC2 is a SRAM cell, however, the other memory cells can be used. The bit lines BL0 and BL1 are connected to a pre-charge circuit 1 and a data read circuit 2.

A pre-charge circuit 1 includes P-channel type MOSFETs (will be abbreviated to PMOS, hereinafter) 3-0 and 3-1. The PMOS 3-0 supplies a pre-charge potential VPRE to the bit line BL0 in response to a pre-charge signal PRE0 and the PMOS 3-1 supplies the pre-charge potential VPRE to the bit line BL1 in response to a pre-charge signal PRE1.

The data read circuit 2 includes sense AMP. circuits S/A0 and S/A1, and a multiplexer 4. The sense AMP. circuit S/A0 amplifies a potential of the bit line BL0 and the sense AMP. circuit S/A1 amplifies a potential of the bit line BL1. The circuits S/A0 and S/A1 respond to S/A enable signals S/AENB0 and S/AENB1, respectively and are alternately activated.

The multiplexer 4 responds to a multiplex control signal MUX and selects output of the circuits S/A0 and S/A1 alternately so as to output the selected output as read data OUTPUT.

An example of configuration of the circuits S/A0 and S/A1 will be described below.

An input/output node NO of the circuit S/A0 is connected to the bit line BL0 through a PMOS 5-0. An input/output node N1 of the circuit S/A1 is connected to the bit line BL1 through a PMOS 5-1. The circuits S/A0 and S/A1 are connected to, for example, a ground potential Vs through a NMOS 6-0 and a NMOS 6-1, respectively.

The PMOS 5-0 responds to the signal S/AENB0. When the circuit S/A0 is activated, the PMOS 5-0 disconnects the circuit S/A0 from the bit line BL0. The NMOS 6-0 responds to the signal S/AENB0. When the circuit S/A0 is activated, the NMOS 6-0 supplies the ground potential Vs to the circuit S/A0. The PMOS 5-1 responds to the signal S/AENB1. When the circuit S/A1 is activated, the PMOS 5-1 disconnects the circuit S/A1 from the bit line BL1. The NMOS 6-1 responds to the signal S/AENB1. When the circuit S/A1 is activated, the NMOS 6-1 supplies the ground potential Vs to the circuit S/A1.

The circuits S/A0 and S/A1 of the first embodiment are single end type sense amplifiers. The single end type sense amplifier compares the potential of the bit line (BL0, BL1) with a reference potential (REF0, REF1) and amplifies a potential difference the bit line and the reference potential, thereby amplifying the potential of the bit line.

The input/output node N0 of the circuit S/A0 is connected to a first input of the multiplexer 4 through a non-inverting buffer circuit 7-0. The input/output node N1 of the circuit S/A1 is connected to a second input of the multiplexer 4 through an inverting buffer circuit 7-1.

Next, read operation of the semiconductor memory device will be described.

Figure 2:
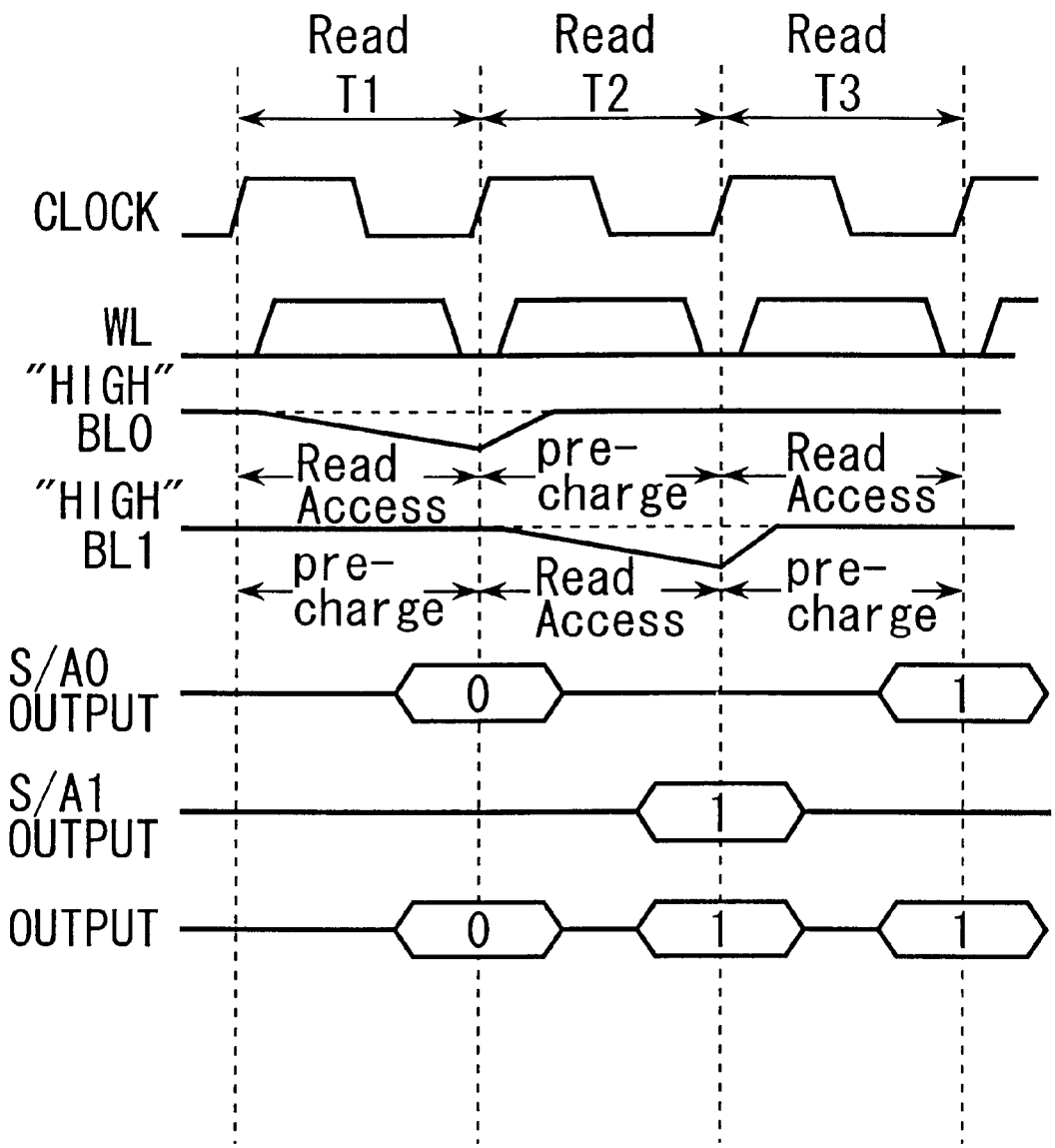
FIG. 2 is an operation waveform chart showing an example of read operation in the semiconductor memory device according to the first embodiment of the present invention.

FIG. 2 is an operation waveform chart showing an example of read operation in the semiconductor memory device according to the first embodiment.

In the example of the operation shown in FIG. 2, it is assumed that when data written in the memory cell is "0", the potential of the bit line BL0 is at "LOW" level and the potential of the bit line BL1 is at "HIGH" level, and when the data is "1", the potential of the bit line BL0 is at "HIGH" level and the potential of the bit line BL1 is at "LOW" level.

As shown in FIG. 2, in the first cycle T1, the bit line BL0 is read-accessed. At this time, the other bit line BL1 is pre-charged. While the bit line BL0 is read-accessed, the circuit S/A0 is activated and data of the bit line BL0 detected and amplified by the circuit S/A0 is output from the multiplexer 4 as read data OUTPUT.

In the next cycle T2, data is read by using the bit line BL1 that has been pre-charged in the first cycle T1. Together with this operation, the bit line BL0 that has been read in the first cycle T1 is pre-charged. At this time, the circuit S/A1 is activated and the data read on the bit line BL1 is detected and amplified by the circuit S/A1. And then the data is output from the multiplexer 4 as read data OUTPUT.

In a following third cycle T3, data is read by using the bit line BL0 that has been pre-charged in the second cycle T2. Together with this operation, the bit line BL1 that has been read in the second cycle T2 is pre-charged. At this time, the circuit S/A0 is activated and the data read on the bit line BL0 is detected and amplified by the circuit S/A0. And then the data is output from the multiplexer 4 as read data OUTPUT.

As described above, in the first embodiment, data read operation is carried out by activating the circuits S/A0 and S/A1 alternately at every cycle of a clock signal CLOCK.

Figure 3:
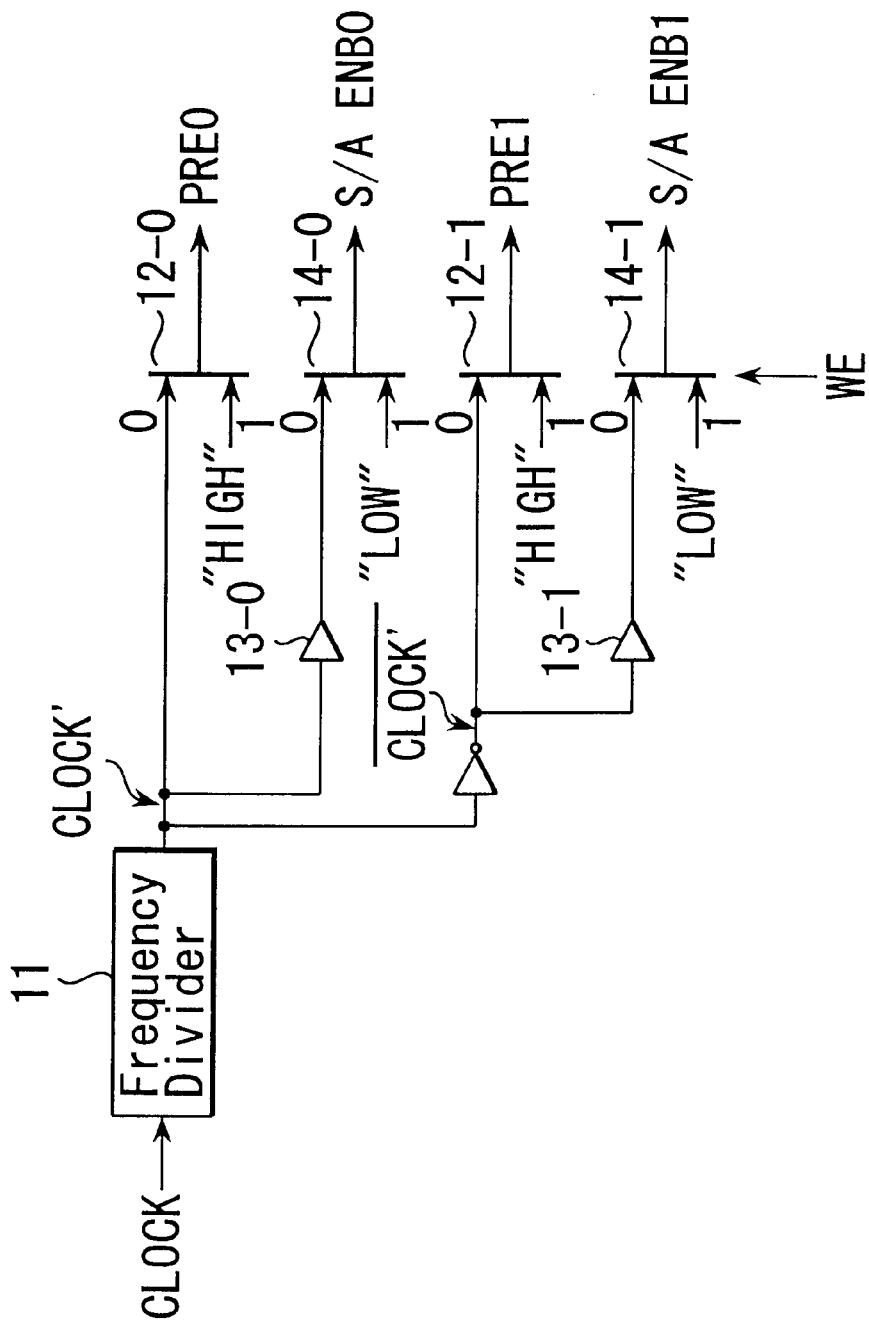
FIG. 3 is a block diagram showing an example of a S/A, pre-charge control circuit included in the semiconductor memory device according to the first embodiment of the present invention.

FIG. 3 is a block diagram showing an example of a S/A, pre-charge control circuit included in the semiconductor memory device according to the first embodiment.

As shown in FIG. 3, the clock signal CLOCK is input to a frequency divider 11. The frequency divider 11 of the first embodiment divides a cycle of the clock signal CLOCK into two cycles. A divided clock signal CLOCK' is input to a first input (0) of a multiplexer 12-0 and a negative-phase clock signal/CLOCK' is input to a first input (0) of a multiplexer 12-1. To each second input (1) of the multiplexers 12-0 and 12-1, electric potential having "HIGH" level is input. Each of the multiplexers 12-0 and 12-1 selects the first input (0) when a write enable signal WE is at "0" level (for example, "LOW" level). On the contrary, when the write enable signal WE is at "1" level (for example, "HIGH" level), multiplexers 12-0 and 12-1 select the second input (1) and output. Output from the multiplexers 12-0 and 12-1 are pre-charge signals PRE0 and PRE1, respectively.

A divided clock signal CLOCK' is input to a first input (0) of a multiplexer 14-0 through a circuit 13-0 and a negative-phase clock signal/CLOCK' is input to a first input (0) of a multiplexer 14-1 through a circuit 13-1. The circuits 13-0 and 13-1 provide timing and a period of time to activate the circuits S/A0 and S/A1, respectively. To the second input (1) of the multiplexers 14-0 and 14-1, electric potential having "LOW" level is input. Each of the multiplexers 14-0 and 14-1 selects the first input (0) when the write enable signal WE is at "0" level (for example, "LOW" level). On the contrary, when the write enable signal WE is at "1" level (for example, "HIGH" level), each of the multiplexers 14-0 and 14-1 selects the second input (1) and outputs. Outputs from each of the multiplexers 14-0 and 14-1 are sense enable signals S/AENB0 and S/AENB1, respectively.

According to the first embodiment as described above, during a cycle of the clock signal CLOCK, data is read by using one bit line that has already been pre-charged and the other bit line is pre-charged. Therefore, it is not needed to wait for completion of pre-charging one bit line but the data can be read by using the other bit line in the next cycle. Accordingly, it is not needed to carry out both data read and pre-charge during a cycle of the clock signal CLOCK.

Thus, as compared with a conventional way in that both data read and pre-charge are to be carried out during a cycle of the clock signal CLOCK, a cycle of the clock signal CLOCK can be curtailed.

Second Embodiment

Figure 4:
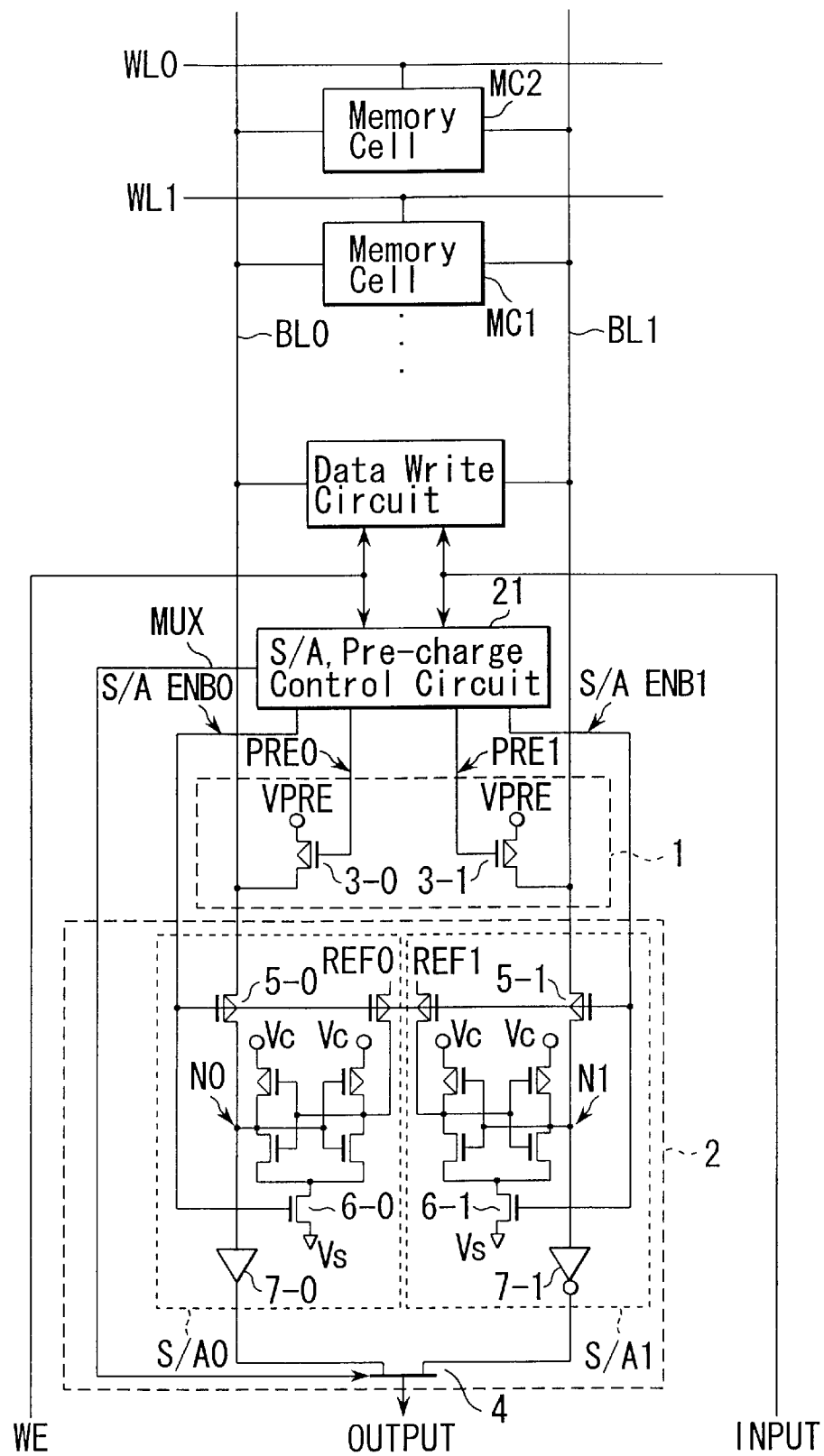
FIG. 4 is a circuit diagram showing a semiconductor memory device according to a second embodiment of the present invention.

FIG. 4 is a circuit diagram showing a semiconductor memory device according to a second embodiment of the invention.

As shown in FIG. 4, what the second embodiment differs from the first embodiment is to have a control circuit 21 that determines circuits S/A to be activated and the pre-charge circuit 1 to be activated in accordance with writing data INPUT.

Next, read/writing operation of the device will be described.

Figure 5:
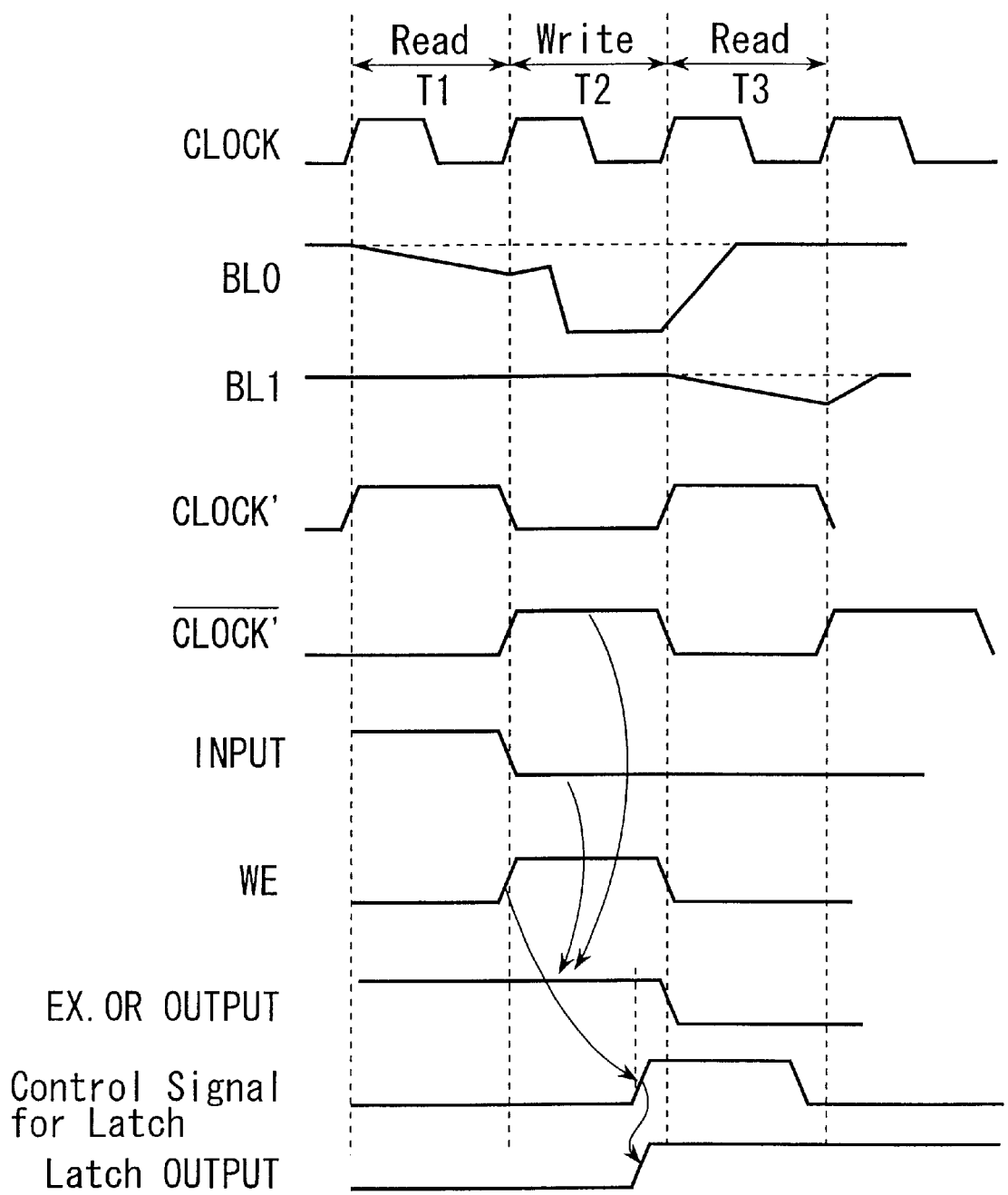
FIG. 5 is an operation waveform chart showing an example of read/writing operation in the semiconductor memory device according to the second embodiment of the present invention.

FIG. 5 is an operation waveform chart showing an example of read/writing operation in the memory device according to the second embodiment.

As shown in FIG. 5, in the read operation, since the circuits S/A to be activated is changed at every cycle of the clock signal CLOCK in the same manner as one of the first embodiment, it is not needed to wait for completion of pre-charging one bit line but the operation can be started by using the other bit line.

When the write operation is carried out, the circuits S/A to be activated in a following cycle is selected in accordance with write data. For example, when write data is "0", electric potential of the bit line BL0 is assumed to change to "LOW" level.

When data "0" is written, the bit line BL0 drops to "LOW" level, whereas the bit line BL1 maintains "HIGH" level. Therefore, when operation to be carried out in a following cycle is read operation, the S/A1 connected to the bit line BL1 is controlled to be active.

On the contrary, when data "1" is written, the bit line BL1 drops to "LOW" level, whereas the bit line BL0 maintains "HIGH" level. Therefore, when operation to be carried out in a following cycle is read operation, the circuit S/A0 connected to the bit line BL0 is controlled to be active.

Figure 6:
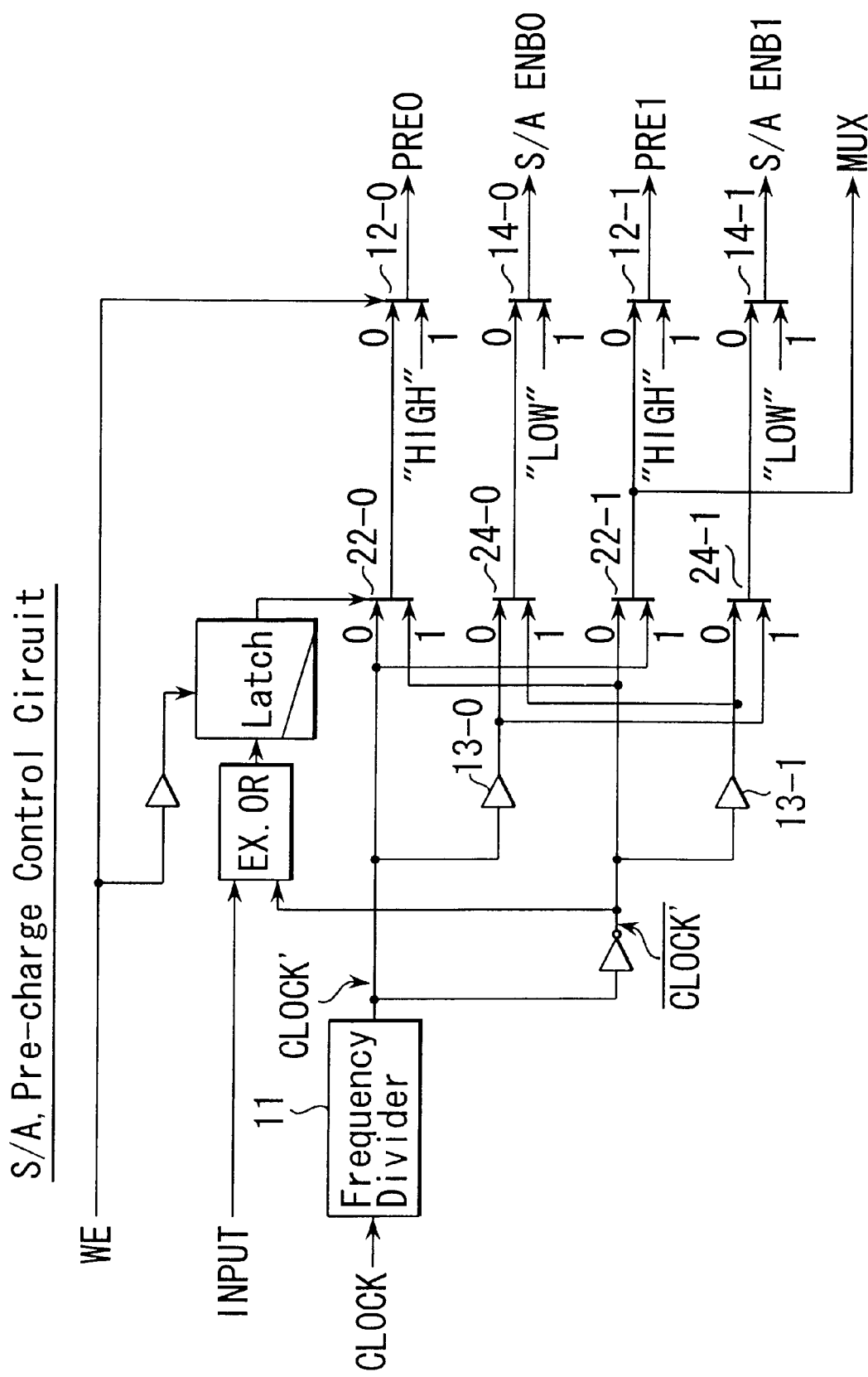
FIG. 6 is a block diagram showing an example of a S/A, pre-charge control circuit included in the semiconductor memory device according to the second embodiment of the present invention.

FIG. 6 is a block diagram showing an example of a S/A, pre-charge control circuit included in the semiconductor memory device according to the second embodiment.

What the control circuit 21 shown in FIG. 6 differs from the control circuit shown in FIG. 3 is to find exclusive OR of the divided clock signal CLOCK' and write data INPUT so as to control multiplexers 22-0, 22-1, 24-0 and 24-1 by using the exclusive OR. When output from the latch is at "0" level, each of the multiplexers 22-0, 22-1, 24-0 and 24-1 selects the first input (0) and when the output is at "1" level, each of the multiplexers selects the second input (1). Accordingly, the signals PRE0 and S/AENB0 can be switched to the signals PRE1 and S/AENB1 respectively, or the signals PRE1 and S/AENB1 can be switched to the signals PRE0 and S/AENB0 respectively, in accordance with the writing data INPUT. More specific explanation is as follows.

Basic operation of the present embodiment is assumed that when the divided clock signal CLOCK' is at "LOW" level, the bit line BL0 is pre-charged.

According to the basic operation, when data read operation is carried out in a following cycle, data is read by using the bit line BL0.

Here, when the divided clock signal CLOCK' is at "LOW" level, it is assumed that the written data is "0" (at "low" level). Then, the bit line BL0 comes to "LOW" level and the bit line BL1 comes to "HIGH" level. That is, on the contrary to the above basic operation, the bit line BL1 is to be pre-charged.

In this state, when data is read in a following cycle, data read operation by using the bit line BL1 can be carried out rapidly because it is not necessary to wait for completion of pre-charge of the bit line BL0.

In order to realize this operation, it is detected whether or not exclusive OR of an inverted signal/CLOCK' to the divided clock signal CLOCK' and write data INPUT, that is, whether or not logical level of the inverted signal/CLOCK' and logical level of the writing data INPUT are consistent with each other.

In this embodiment, when the two levels are consistent with each other, the bit line is pre-charged as in the same manner as the basic operation. Thus, switching the circuit S/A to be activated is not carried out.

On the contrary, when the two levels are not consistent with each other, the opposite bit line to one in the basic operation is pre-charged. Therefore, the circuit S/A to be activated is to be switched.

More specifically, in the inconsistent case, the signals PRE0 and S/AENB0 are switched to the signals PRE1 and S/AENB1, respectively, or the signals PRE1 and S/AENB1 are switched to the signals PRE0 and S/AENB0, respectively. Accordingly, in a following cycle, it is possible to read data by using the bit line which has been changed to "HIGH" level in accordance with the writing data INPUT.

According to the second embodiment described above, it is possible to obtain the similar effect as the first embodiment.

Furthermore, in data read operation following to the data writing, the S/A to be activated is switched in accordance with the writing data so that the data is read by using the bit line which was changed to "HIGH" level in the data writing. As a consequence, it is not necessary to wait for completion of pre-charging the bit line which changed to "LOW" level in the data writing but data can be read in a following cycle.

Note that when data is written again after data writing, it is obvious that pre-charge is not necessary. Thus, data can be written in a following cycle.

Third Embodiment

Figure 7:
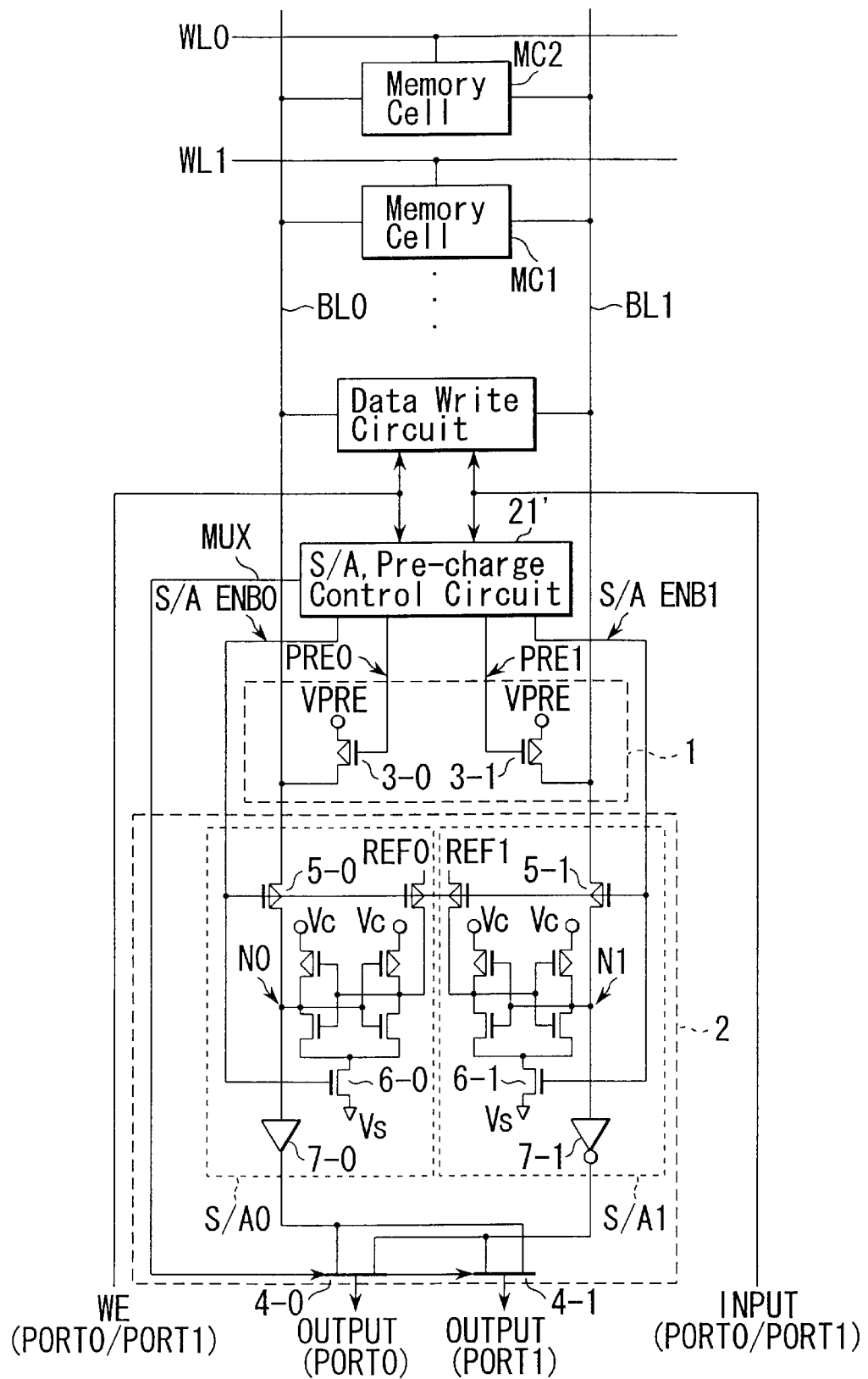
FIG. 7 is a circuit diagram showing the semiconductor memory device according to a third embodiment of the present invention.

FIG. 7 is a circuit diagram showing a memory device according to a third embodiment of the present invention.

The third embodiment is a modification of the second embodiment. In the third embodiment, the memory device behaves as a pseudo two-ports RAM capable of carrying out a plurality of read/writing operation in a cycle.

As shown in FIG. 7, what the third embodiment differs from the second embodiment is to have a multiplexer 4-0 connected to a first port PORT0 and a multiplexer 4-1 connected to a second port PORT1.

Next, read/writing operation of the device will be described.

Figure 8:
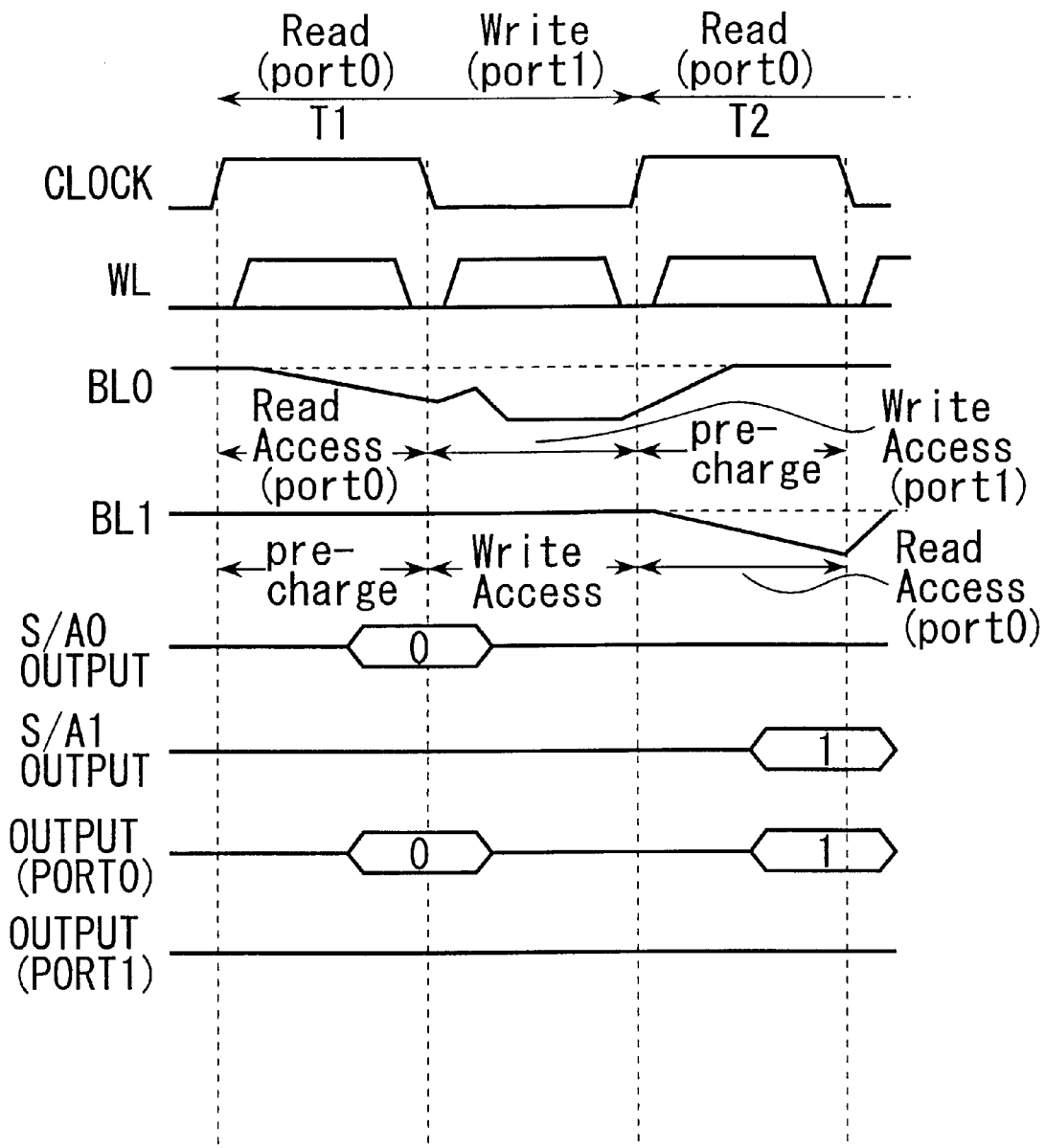
FIG. 8 is an operation waveform chart showing an example of read/writing operation in the semiconductor memory device according to the third embodiment of the present invention.

FIG. 8 is an operation waveform chart showing an example of read/writing operation of the memory device according to the third embodiment.

As shown in FIG. 8, data "0" has been written in a memory cell. The data "0" is read at the first port PORT0 during the first half of a cycle T1 and written at the second port PORT1 during the latter half of the cycle T1. Furthermore, a case where the data is read at the first port PORT0 during the first half of the following cycle T2 is considered. In addition, when the written data is "0", it is assumed that the potential of the bit line BL0 changes to "LOW" level.

It is adapted that the circuits S/A0 is used in a first read operation during the first half of the cycle T1. And then, electric potential of the bit line BL0 drops gradually, since the data "0" has been written in the bit line BL0. On the other hand, the potential of the bit line BL1 is still pre-charged.

In the following writing operation during the latter half of the cycle T1, the potential of the bit line BL0 changes to "LOW" level and the potential of the bit line BL1 is maintained at "HIGH" level.

In the following read operation during the first half of the cycle T2, as is the case with the second embodiment, the circuit S/A1, which has already been pre-charged and is connected to the bit line BL1, is activated. In addition, the multiplexer 4-0 is controlled so that the output can be linked to the first port PORT0.

As described above, data read and data writing are carried out independently during a cycle of the clock signal in the pseudo two-port RAM.

Next, read operation will be described.

Figure 9:
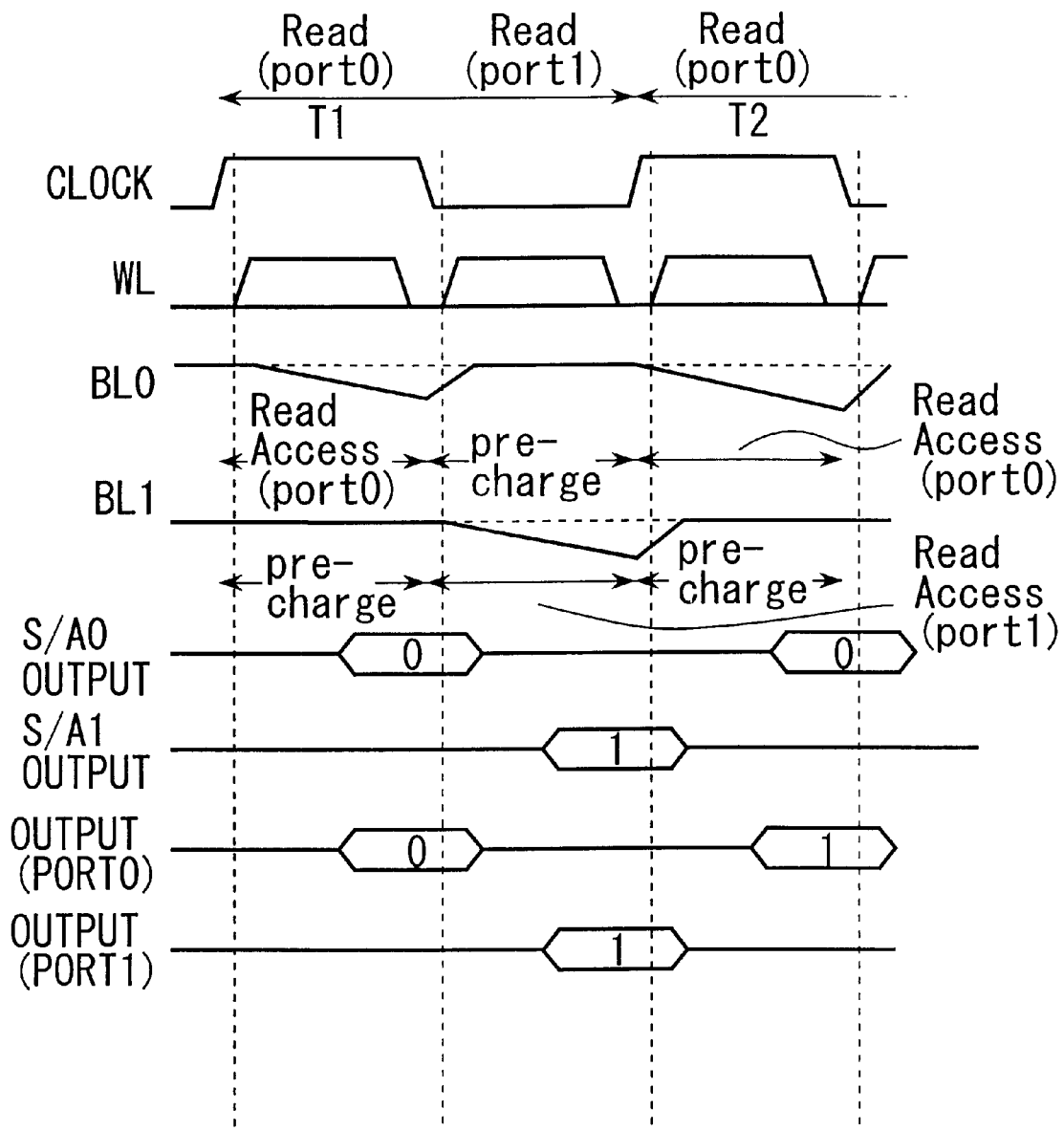
FIG. 9 is an operation waveform chart showing an example of read operation in the semiconductor memory device according to the third embodiment of the present invention.

FIG. 9 is an operation waveform chart showing an example of read operation in the semiconductor memory device according to the third embodiment. This example is assumed that data read is carried out successively.

As shown in FIG. 9, data "0" is written in a memory cell. The data is read at the first port PORT0 during the first half of a cycle T1 and read at the second port PORT1 during the latter half of the cycle. Furthermore, a case where the data is read at the first port PORT0 during the first half of a following cycle T2 is considered. In addition, when the written data is "0", it is assumed that the potential of the bit line BL0 changes to "LOW" level.

During the first half of the cycle T1, data is read from the bit line BL0 by using the circuit S/A0. At this time, the bit line BL1 is still pre-charged.

Next, during the latter half of the cycle T1, data is read from the bit line BL1 by using the circuit S/A1 and the bit line BL0 is pre-charged.

And then, during the first half of the cycle T2, data is read from the bit line BL0 by using the circuit S/A0 and the bit line BL1 is pre-charged.

As described above, data read is carried out twice during a cycle of the clock signal in the pseudo two-port RAM.

Figure 10:
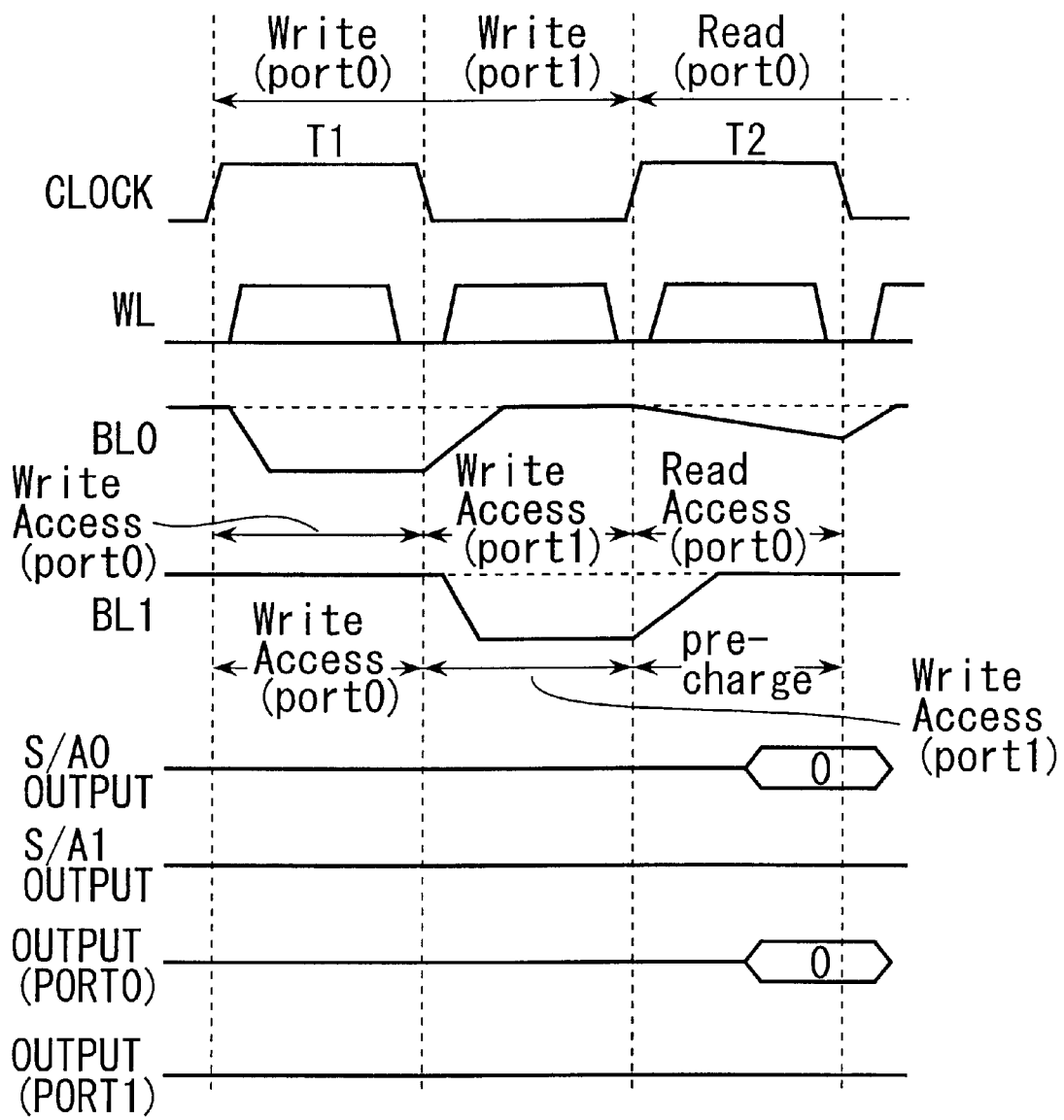
FIG. 10 is an operation waveform chart showing an example of writing operation in the semiconductor memory device according to the third embodiment of the present invention.

Note that FIG. 10 is an operation waveform chart for assumption that the data write is carried out successively.

As shown in FIG. 10, even when successive data are written, data write is carried out twice during a cycle of the clock signal.

Figure 11:
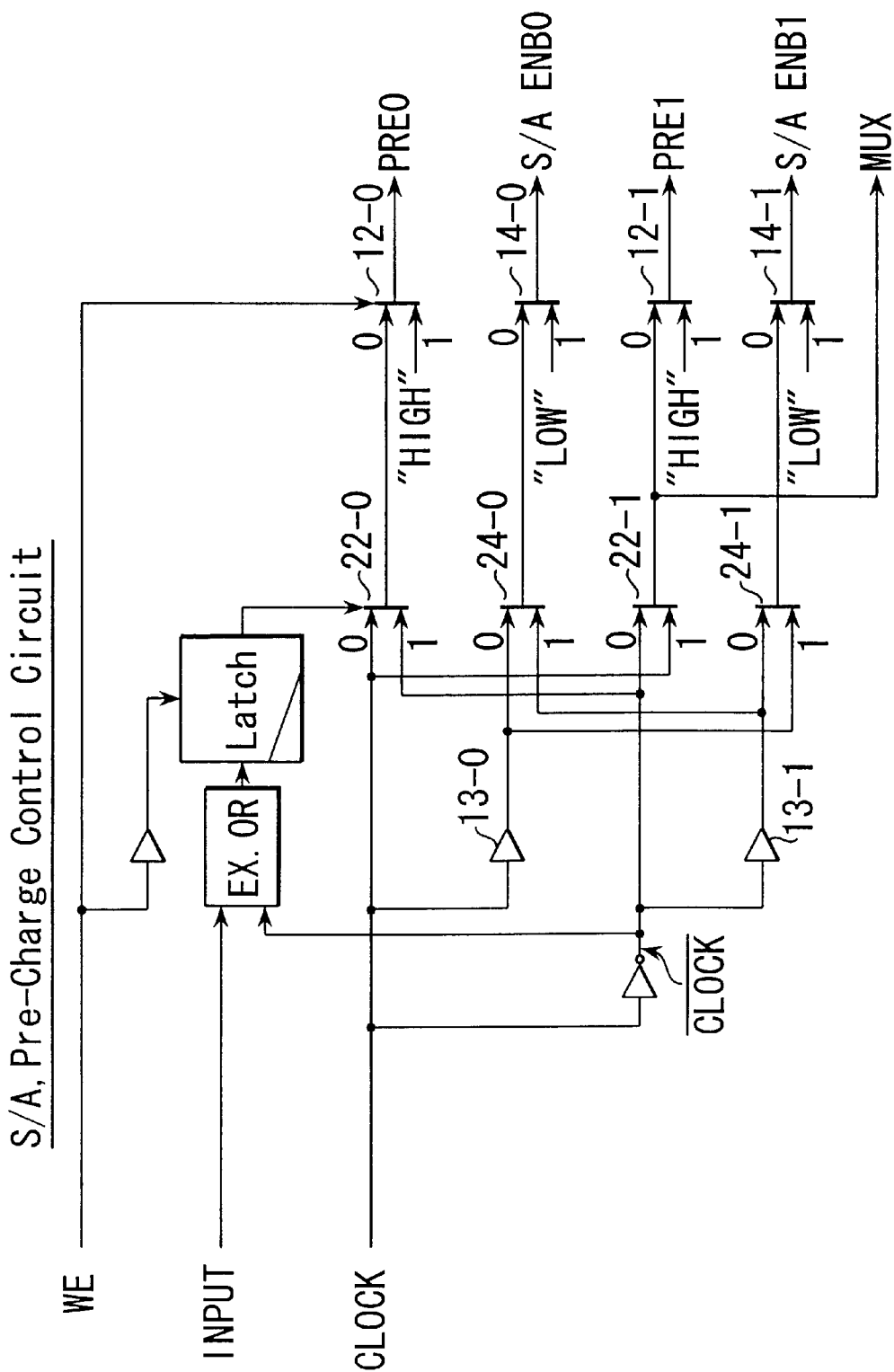
FIG. 11 is a block diagram showing an example of a S/A, pre-charge control circuit included in the semiconductor memory device according to the third embodiment of the present invention.

FIG. 11 is a block diagram showing an example of a S/A, pre-charge control circuit included in the semiconductor memory device according to the third embodiment.

As shown in FIG. 11, what a control circuit 21' differs from the control circuit 21 is that the circuit 21' does not have the frequency divider 11. In the third embodiment, the circuits S/A0 and S/A1 are activated by turns in the first half and the latter half of a cycle of the clock signal CLOCK. Thus, it is not necessary to divide the clock signal CLOCK.

As described above, it is possible to apply the invention to the pseudo two-port RAM.

Fourth Embodiment

Figure 12:
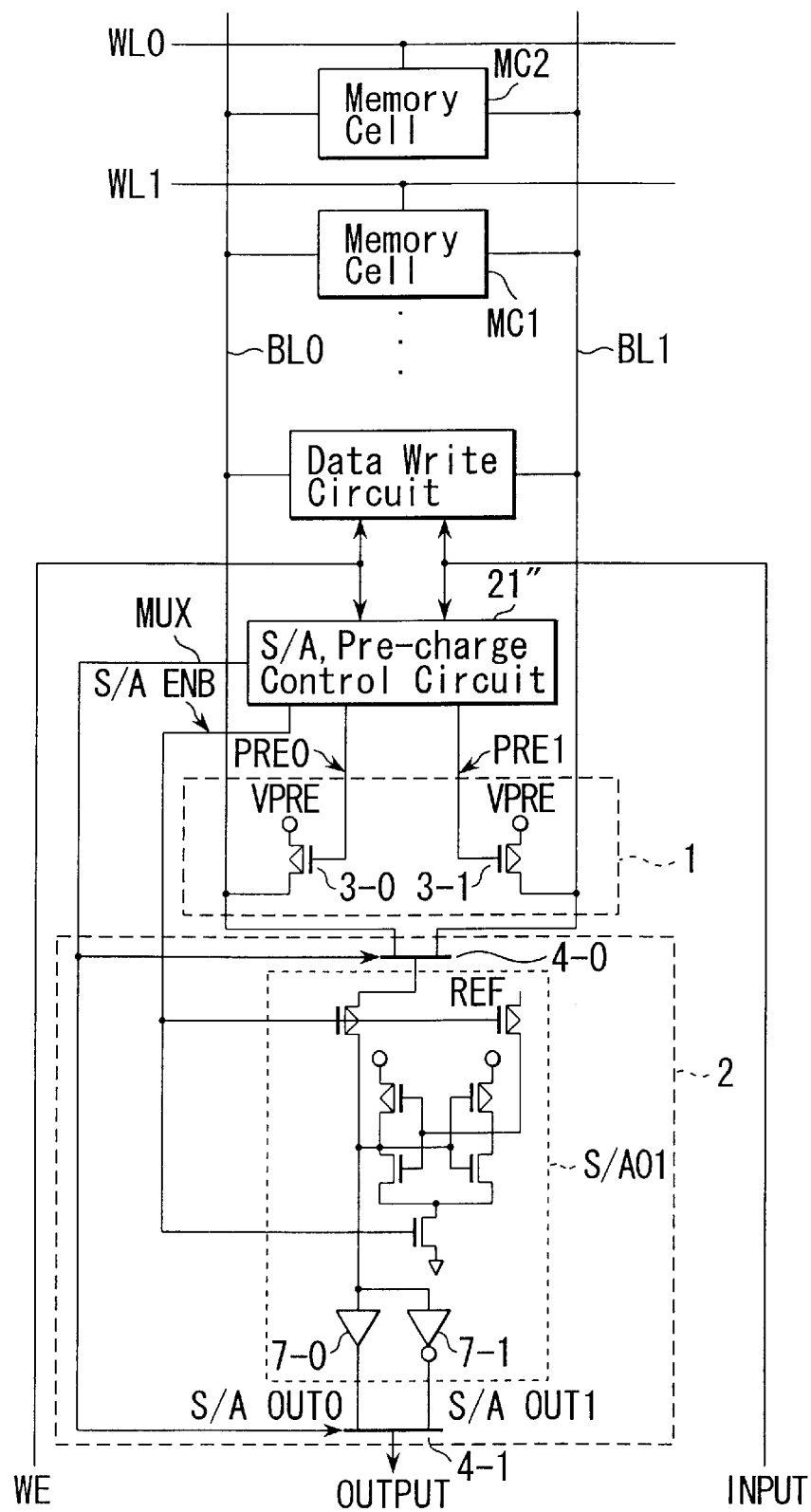
FIG. 12 is a circuit diagram showing the semiconductor memory device according to a fourth embodiment of the present invention.

FIG. 12 is a circuit diagram showing a memory device according to a fourth embodiment of the invention.

As shown in FIG. 12, what the fourth embodiment differs from the second embodiment is that the circuit is adapted to a common sense AMP. circuit S/A01 shared between the bit lines BL0 and BL1.

Read/writing operation of the device will be described below.

Figure 13:
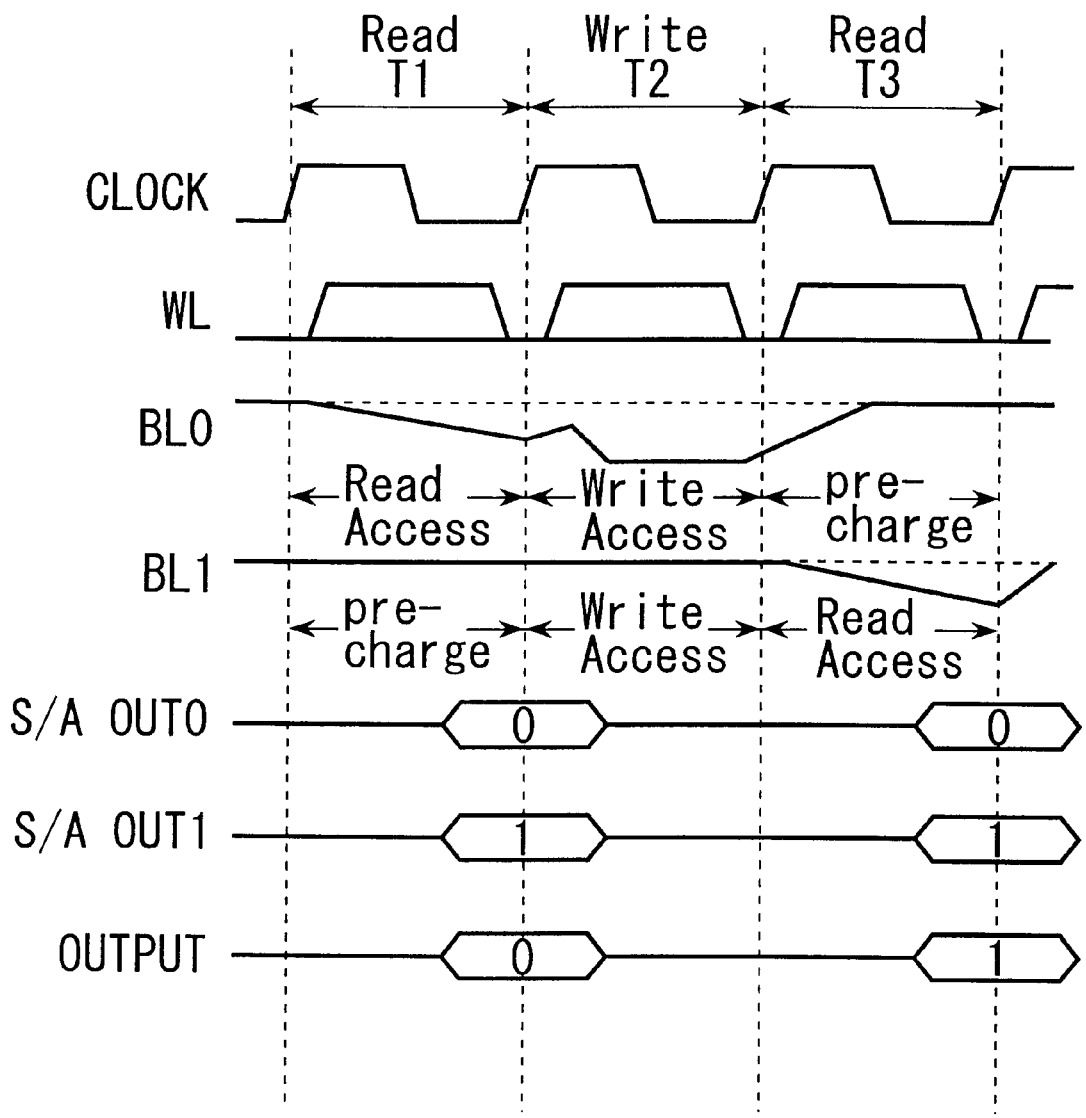
FIG. 13 is an operation waveform chart showing an example of read operation in the semiconductor memory device according to the fourth embodiment of the present invention.

FIG. 13 is an operation waveform chart showing an example of read/writing operation of the memory device according to the fourth embodiment of the invention. In this description, it is assumed that when data is "0", the BL0= "LOW" or BL1="HIGH", and when the data is "1", the BL0="HIGH" or the BL1="LOW", in the same manner as described above.

As shown in FIG. 13, data read is carried out in a cycle T1.

At this time, since the bit line BL1 is in a pre-charge state, the bit line BL0 is selected by using the multiplexer 4-0 (see. FIG. 12) and connected to the common sense AMP. circuit S/A01. Furthermore, as the bit line BL0 is selected, the output S/AOUT0 is selected by using the multiplexer 4-1 (see. FIG. 12) and adapted to output OUTPUT. In this example, as the bit line BL0 is at "LOW" level, the output OUTPUT is data "0".

In a following cycle T2, data writing is carried out. In this example, data "0" is written.

In a following cycle T3, data read is carried out. In the invention, it is basic that the bit lines BL0 and BL1 are selected by turns at every cycle as described above. According to this basic, as the bit line BL0 was selected in the cycle T1, the bit line BL1 was selected in the cycle T2. Thus, the bit line BL0 is to be selected in this cycle T3. However, as described in the second embodiment, when operation in the previous cycle T2 was data writing, it is determined which bit line to be selected, the BL0 or the BL1, referring to the written data.

In the previous cycle T2, data "0" was written. Therefore, the bit line BL0 is "LOW" and the bit line BL1 is "High".

As a consequence, in this cycle T3, the bit line BL1 is selected by using the multiplexer 4-0 and connected to the common sense AMP. circuit S/A01. Furthermore, as the bit line BL1 is selected, output S/A0UT1 is selected by using the multiplexer 4-1 and adapted to output OUTPUT. In this example, as the bit line BL1 is "LOW", the output OUTPUT is data "1". In addition, the bit line BL0 is to be pre-charged during the cycle T3.

Note that when data "1" is written in the previous cycle T2, the bit line BL0 is "HIGH" and the bit line BL1 is "LOW". Thus, on the contrary to the above, the bit line BL0 is selected by using the multiplexer 4-0 and connected to the common sense AMP. circuit S/A01. And then, output S/AOUT0 is selected by using the multiplexer 4-1 and adapted to output OUTPUT.

Figure 14:
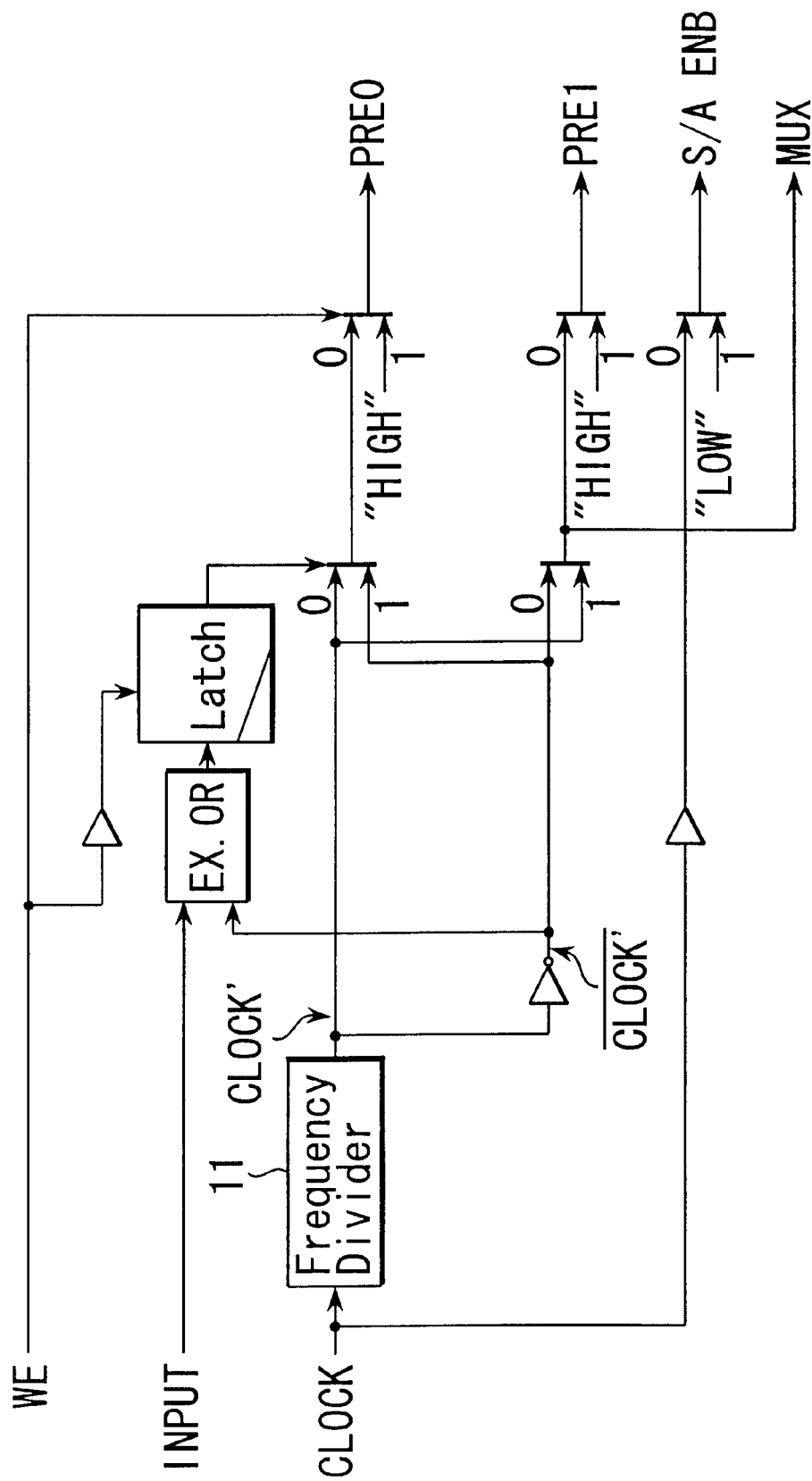
FIG. 14 is a block diagram showing an example of a S/A, pre-charge control circuit included in the semiconductor memory device according to the fourth embodiment of the present invention.
Figure 15:
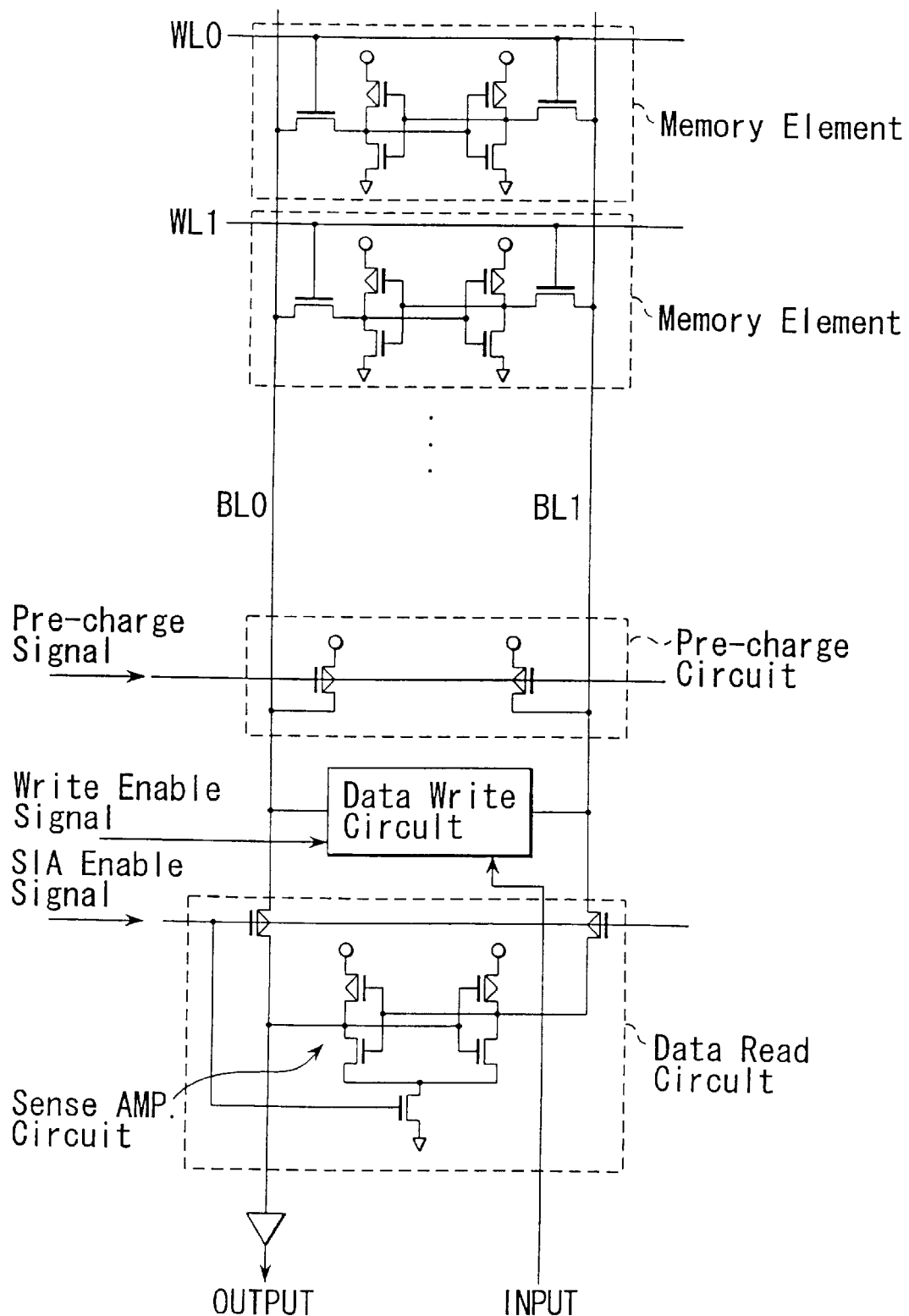
FIG. 15 is a circuit diagram showing a conventional memory device.
Figure 16:
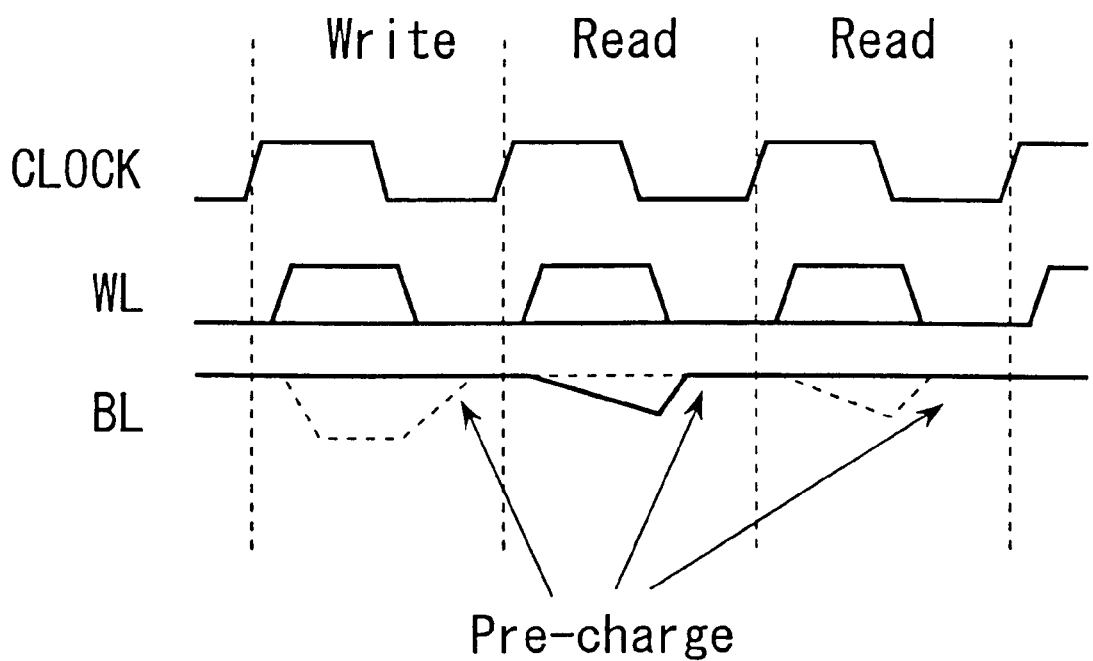
FIG. 16 is an operation waveform chart showing writing/read operation of the conventional memory device.

FIG. 14 shows an example of a S/A, pre-charge control circuit included in the semiconductor memory device according to the fourth embodiment of the invention.

In the fourth embodiment as described above, data read can be carried out successively without waiting for pre-charge, and thus, operation frequency of the memory device can be improved.

In addition, as the sense AMP. circuit is adapted to the common sense AMP. circuit in the fourth embodiment, the number of sense AMP. circuits can be reduced in comparison with the first to third embodiments, providing an advantage of high-integration or decreasing electric power consumption.

Note that the common sense AMP. circuit described in the fourth embodiment can obviously be applied to the pseudo two-port RAM in the third embodiment.

The invention has been described with the first to fourth embodiments. The invention is not limited to these embodiments but can also be modified variously without departing from the spirit and scope of the present invention.

For example, in the pseudo two-port RAM according to the third embodiment, a sense AMP. circuit S/A to be activated is switched in accordance with the writing data as is the case with the second embodiment. However, it may be preferable that the sense AMP. circuits S/A to be activated are only switched by turns in the first and latter half of a cycle.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a first bit line;
    a second bit line;
    a memory cell electrically coupled to the first bit line and the second bit line;
    a first amplification circuit configured to amplify a potential of the first bit line, to compare the potential of the first bit line with a reference potential, and to amplify a potential difference of the potential of the first bit line and the reference potential; and
    a second amplification circuit configured to amplify a potential of the second bit line, to compare the potential of the second bit line with the reference potential, to amplify a potential difference of the potential of the second bit line and the reference potential, to be inactive when the first amplification circuit is active, and to be active when the first amplification circuit is inactive, in a read operation.

2. The device according to claim 1, wherein the first and the second amplification circuits are alternately activated in synchronization with a clock signal.

3. The device according to claim 1, further comprising:
a multiplexer which selects an output of the first amplification circuit or an output of the second amplification circuit.

4. The device according to claim 2, further comprising:
a multiplexer which alternately selects an output of the first amplification circuit and an output of the second amplification circuit in synchronization with the clock signal.

5. The device according to claim 1, further comprising:
an amplification control circuit configured to control at least one of the first amplification circuit and the second amplification circuit to be activated in accordance with write data.

6. The device according to claim 5, wherein the amplification control circuit is configured to activate at least one of the first amplification circuit and the second amplification circuit and to amplify the potential of the bit line to a pre-charge level, in a read operation following to a write operation.

7. The device according to claim 1, wherein an output of the first amplification circuit is coupled to a first port which is to be selected during a period in a cycle of a clock signal, and an output of the second amplification circuit is coupled to a second port which is to be selected during the other period in the cycle of the clock signal.

8. The device according to claim 7, further comprising:
a multiplexer which selects the first port or the second port and electrically couples a selected port to outputs of the first and second amplification circuits.

9. A semiconductor device comprising:
a first bit line;
a second bit line;
a memory cell electrically coupled to the first bit line and the second bit line;
an amplification circuit configured to amplify a potential of the first bit line and a potential of the second bit line; and
a multiplexer configured to select the first bit line or the second bit line and to electrically couple a selected bit line to the amplification circuit.

10. A semiconductor device comprising:
a first bit line;
a second bit line;
a memory cell electrically coupled to the first bit line and the second bit line;
a first amplification circuit configured to amplify a potential of the first bit line;
a second amplification circuit configured to amplify a potential of the second bit line; and
a pre-charge circuit configured to pre-charge the first and second bit lines, the pre-charge circuit configured to pre-charge the second bit line when the first amplification circuit is active and to pre-charge the first bit line when the second amplification circuit is active by alternately pre-charging the first and second bit lines.

11. The device according to claim 10, wherein the first and the second amplification circuits are alternately activated in synchronization with a clock signal.

12. The device according to claim 10, further comprising:
a multiplexer that selects an output of the first amplification circuit or an output of the second amplification circuit.

13. The device according to claim 11, further comprising:
a multiplexer that alternately selects an output of the first amplification circuit and an output of the second amplification circuit in synchronization with the clock signal.

14. The device according to claim 10, wherein the first amplification circuit compares the potential of the first bit line with a reference potential and amplifies a potential difference of the potential of the first bit line and the reference potential, and
the second amplification circuit compares the potential of the second bit line with the reference potential and amplifies a potential difference of the potential of the second bit line and the reference potential.

15. The device according to claim 10, further comprising:
an amplification control circuit that controls one of the first amplification circuit and the second amplification circuit to be activated, in accordance with write data.

16. The device according to claim 15, wherein the amplification control circuit activates one of the first amplification circuit and the second amplification circuit that amplifies the potential of the bit line that has changed to a pre-charge level, in a read operation following a write operation.

17. The device according to claim 10, wherein an output of the first amplification circuit is coupled to a first port that is to be selected during a period in a cycle of a clock signal, and an output of the second amplification circuit is coupled to a second port that is to be selected during the other period in the cycle of the clock signal.

18. The device according to claim 17, wherein, during the cycle of the clock signal, at least one of a successive read operation, a successive write operation, and a successive read/write operation, is carried out.

19. The device according to claim 17, further comprising:
a multiplexer that selects the first port or the second port, and electrically couples the selected port to outputs of the first and second amplification circuits.

20. A semiconductor device comprising:
a first bit line;
a second bit line;
a memory cell electrically coupled to the first bit line and the second bit line;
a first amplification circuit configured to amplify a potential of the first bit line;
a second amplification circuit configured to amplify a potential of the second bit line, to be inactive when the first amplification circuit is active, and to be active when the first amplification circuit is inactive, in a read operation; and
an amplification control circuit configured to control at least one of the first amplification circuit and the second amplification circuit to be activated in accordance with write data.

21. The device according to claim 20, wherein the amplification control circuit is configured to activate at least one of the first amplification circuit and the second amplification circuit and to amplify the potential of the bit line to a pre-charge level, in a read operation following a write operation.

22. A semiconductor device comprising:
a first bit line;
a second bit line;
a memory cell electrically coupled to the first bit line and the second bit line;
a first amplification circuit configured to amplify a potential of the first bit line;

a second amplification circuit configured to amplify a potential of the second bit line, to be inactive when the first amplification circuit is active, and to be active when the first amplification circuit is inactive, in a read operation, wherein an output of the first amplification circuit is coupled to a first port which is to be selected during a period in a cycle of a clock signal, and an output of the second amplification circuit is coupled to a second port which is to be selected during another period in a cycle of a clock signal.

23. The device according to claim 22, wherein, during the cycle of the clock signal, at least one of a successive read operation, a successive write operation, and a successive read/write is to be carried out.

24. The device according to claim 22, wherein, during the cycle of the clock signal, at least one of a successive read operation, a successive write operation, and a successive read/write is to be carried out.

25. The device according to claim 22, further comprising:

multiplexer configured to select the first port or the second port and to electrically couple a selected port to outputs of the first and second amplification circuits.

* * * * *